United States Patent
Butler et al.

(12)
(10) Patent No.: US 6,870,863 B1
(45) Date of Patent: Mar. 22, 2005

(54) METHODS OF CONTROLLING A LASER IN A WDM APPLICATION

(75) Inventors: Graham Butler, Chitwell (GB); Michael Leach, Nottingham (GB)

(73) Assignee: Marconi UK Intellectual Property Ltd., Coventry (GB)

( * ) Notice: Subject to any disclaimer, the term of this patent is extended or adjusted under 35 U.S.C. 154(b) by 0 days.

(21) Appl. No.: 09/450,055

(22) Filed: Nov. 29, 1999

(30) Foreign Application Priority Data

Aug. 13, 1999 (GB) .............................................. 9919047

(51) Int. Cl.$^7$ ................................................ H01S 3/13
(52) U.S. Cl. .............................. 372/29.014; 372/29.01; 372/31
(58) Field of Search ........................ 372/29.01, 29.014, 372/31, 29, 29.015, 20

(56) References Cited

U.S. PATENT DOCUMENTS

| | | | |
|---|---|---|---|
| 4,927,266 A | * 5/1990 | Sugiura et al. | .......... 356/243.1 |
| 5,185,643 A | 2/1993 | Vry et al. | |
| 5,406,172 A | 4/1995 | Bennett | |
| 5,754,571 A | * 5/1998 | Endoh et al. | .................. 372/20 |
| 5,812,572 A | 9/1998 | King et al. | |
| 6,075,613 A | * 6/2000 | Schermer et al. | ........... 356/446 |
| 6,222,861 B1 | * 4/2001 | Kuo et al. | ..................... 372/20 |
| 6,327,064 B1 | * 12/2001 | Zhu | .......................... 359/187 |
| 6,438,147 B1 | * 8/2002 | Roychoudhuri et al. | ...... 372/20 |
| 6,724,786 B2 | * 4/2004 | Jacobowitz et al. | .......... 372/20 |

FOREIGN PATENT DOCUMENTS

| | | |
|---|---|---|
| EP | 0 622 877 A1 | 11/1994 |
| EP | 0 818 859 A1 | 1/1998 |
| EP | 0 910 184 A2 | 4/1999 |

* cited by examiner

*Primary Examiner*—MinSun Harvey
*Assistant Examiner*—Cornelius H Jackson
(74) *Attorney, Agent, or Firm*—Kirschstein, et al.

(57) ABSTRACT

A laser used in a DWDM optical-fiber application is controlled so that, before it is powered up or down, its output power is maximally attenuated, the result being minimal cross-channel interference due to out-of-spec. wavelength. Laser control is further characterized by the steps of: (a) with laser current at zero, establishing a desired temperature of operation of the laser; (b) with output attenuation at maximum, increasing the current and regulating it to a level at which the design operating wavelength is achieved, and (c) decreasing the attenuation until the desired output power to the optical-fiber link is attained. Maximum attenuation is preferably applied during step (a).

16 Claims, 4 Drawing Sheets

METHODS OF CONTROLLING A LASER IN A WDM APPLICATION

BACKGROUND OF THE INVENTION

The invention relates to a method of controlling a laser in a WDM application, in particular, but not exclusively, a DWDM application.

Lasers used as light sources in WDM (Wavelength Division Multiplexing) applications are each designed to operate at a specific wavelength. This wavelength is set by the laser manufacturer and depends on the temperature at which the laser is operating and the current driving the laser. Thus the manufacturer will usually specify an operating temperature and an operating current which will nominally result in operation at the design wavelength of the laser.

In WDM optical transmission systems the wavelength of the source laser needs to be controlled to within tight limits. Any inaccuracy in wavelength setting will result in cross-signal interference and consequent corruption of traffic in adjacent channels, which the user will naturally want to avoid. In DWDM (Dense Wavelength Division Multiplexing) systems, where the channel spacing may be of the order of 100 GHz or less, the wavelength requirements are particularly stringent and are conventionally satisfied by the use of a laser temperature feedback loop which maintains the laser at the manufacturer's stipulated temperature.

A drawback with this conventional control arrangement, however, is that it is impossible to adequately control the wavelength during power-up and power-down situations, where the discontinuities involved give rise to large fluctuations in wavelength value which can affect performance in the manner already described. This is a particular problem during ALS (Automatic Laser Shutdown) operation, when, as part of a safety measure, the laser is disabled when a break in the downstream optical fibre is suspected. During ALS, it is usual to enable the optical output for a short period on a regular basis (e.g. for 2 seconds every 90 seconds, or thereabouts) in order to check whether the fibre break has been repaired. Although temperature is normally held at its stipulated operating value during this process, because the laser is coupled to a large thermal mass (a cooling/heating element), changes in temperature of the lasing element itself which occur during power-up/power-down cannot be quickly compensated for by the temperature control loop (response time is around 10 seconds), and so wavelength drifts significantly from its stipulated value during ALS operation.

The present invention aims to provide a laser control arrangement which mitigates this drawback.

SUMMARY OF THE INVENTION

In accordance with the present invention, a method of controlling a laser in a WDM application comprises the steps of, in the order given:

(a) establishing a predetermined laser temperature;
(b) controlling the laser current to give a wavelength of operation substantially equal to a desired wavelength, and
(c) establishing a predetermined laser output power.

Step (c) is advantageously carried out by means of an attenuator situated at the laser output.

Prior to step (b) there may be included the step of setting the attenuator to a maximum attenuation setting and step (c) may comprise the step of reducing the attenuation setting to a desired level. Maximum attenuation may occur during step (a).

It is preferred that the attenuation be reduced gradually. The reduction may start while the operating wavelength is still converging towards its final value. Also, during a laser shutdown procedure the attenuation may be increased gradually. All gradual changes in attenuation preferably take the form of ramp-type changes.

Steps (a), (b) and (c) may be performed using respective control loops, which control loops may have different time responses. The power-setting loop may have the fastest response and the temperature-setting loop the slowest response. Preferably the control loops are digital control loops.

Step (b) may include the steps of setting the laser current to a value which will produce nominally the desired wavelength value, and adjusting the current via the relevant control loop to achieve substantially the actual desired wavelength value.

The wavelength-monitoring process may be carried out using two wavelength-monitoring means having maximum sensitivity at wavelengths respectively slightly greater than and less than the nominal operating wavelength. The wavelength-monitoring process may be such that the operating wavelength corresponds to that wavelength which gives rise to equal output signals from the two wavelength-monitoring means.

Step (a) is preferably performed only once when the laser equipment is initially powered up, the laser temperature being maintained constant while said equipment is in service.

In accordance with a second aspect of the invention, there is provided a method of controlling a laser in a WDM application, in which prior to a power-up or power-down operation on the laser an attenuation factor of an attenuator which is operative to attenuate the output power of the laser is set to a high value.

In a power-up routine, following the setting of the attenuation factor to a high value (which will normally be the maximum value the attenuator is capable of), the laser current may be increased to a desired operating level and, when an operating wavelength of the laser has settled to a given value or has come to within a given tolerance of a given value, the attenuation factor may be reduced to a normal working level. The attenuation may be gradually reduced after the wavelength has settled to a final value.

In a power-down routine, following the setting of the attenuation factor to a high value, the laser current may be reduced to a substantially zero level.

The laser may form part of a DWDM application.

Under a third aspect, the invention provides apparatus for controlling a laser in a WDM application, comprising a temperature-control loop for controlling the laser temperature, a wavelength-control loop for controlling an operating wavelength of the laser, a power-control loop for controlling the output power of the laser, and a control means for co-ordinating said control loops such as to establish desired values of the temperature, wavelength and power parameters in a given sequence.

The control loops may have different responses, the temperature-control loop having the slowest response and the power-control loop having the fastest response.

The wavelength-control loop may comprise a pair of wavelength monitors having maximum sensitivities respectively slightly greater than and less than a desired operating wavelength. Photodiodes may be employed for the monitors.

The temperature-control loop may comprise a temperature sensor for monitoring laser temperature, the temperature sensor forming part of a Wheatstone bridge, the bridge being operative to provide a temperature-error signal to operate the temperature-control loop.

The control means may be configured to establish the following operational sequence: firstly, establishing of a desired laser temperature; secondly, establishing of a desired wavelength through control of laser current; thirdly, establishing of a desired laser output power.

The control means may be configured to ensure that, prior to a power-up or power-down operation on the laser, the output power of the laser is reduced to a low level.

The power-control loop may comprise an attenuator situated at an output of the laser.

BRIEF DESCRIPTION OF THE DRAWINGS

An embodiment of the invention will now be described with reference to the drawings, of which.

DETAILED DESCRIPTION OF AN EMBODIMENT OF THE INVENTION

Figure 1:
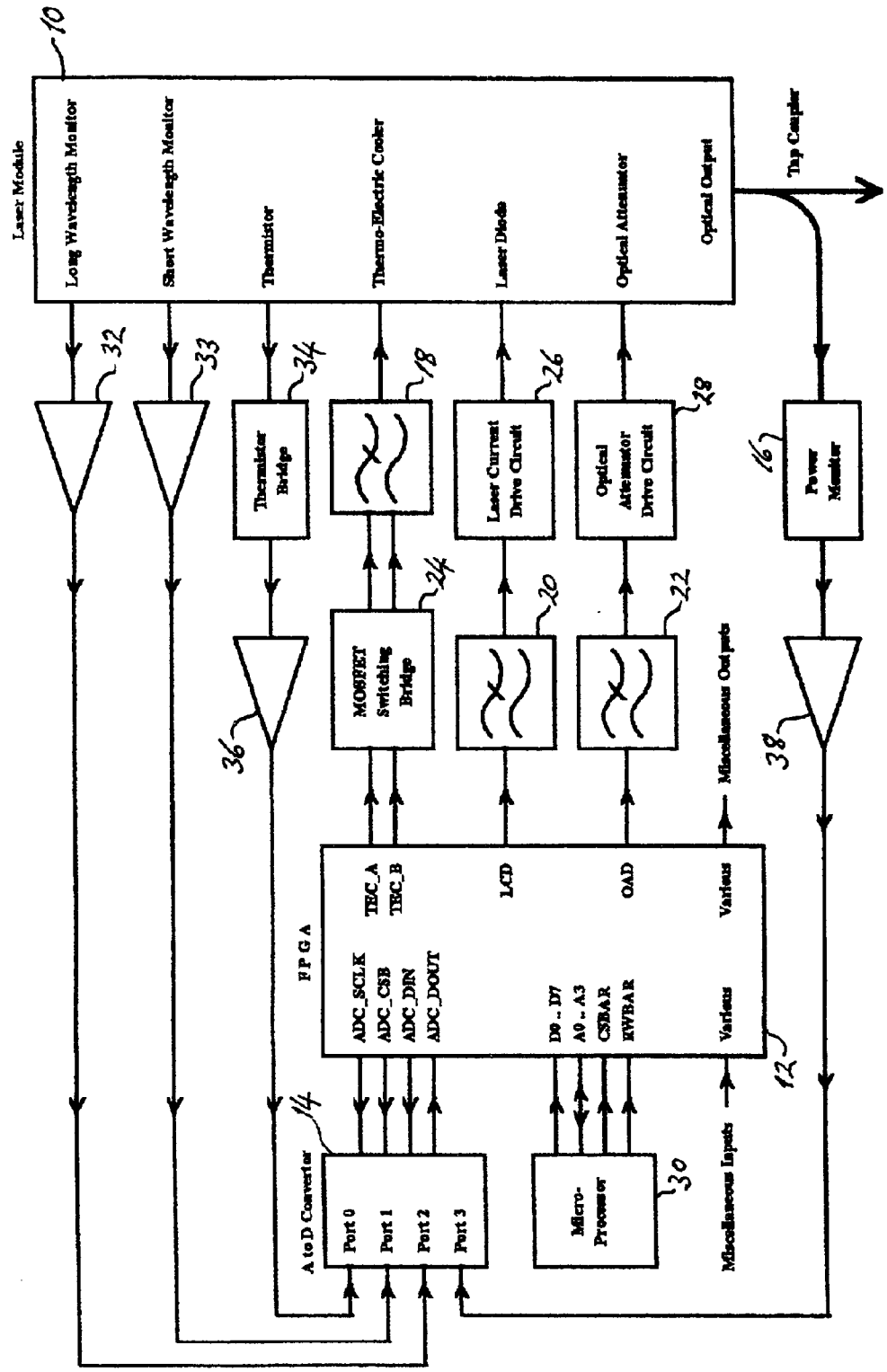
FIG. 1 is a block schematic diagram of a laser-control apparatus in accordance with the invention.

FIG. 1 shows a schematic diagram of an embodiment of a digital laser controller according to the invention comprising a laser module 10, a digital controller 12, an ADC (analogue-to-digital converter) 14, a laser power monitor 16, various output filters 18, 20, 22 and various drive circuits 24, 26, 28. Supervising the operation of the system is a microprocessor 30, which supplies static data to the various circuitry, such data being non-safety-critical information including the level of the desired power output.

The laser module contains the laser diode itself, a thermistor for detecting the operating temperature of the module, a thermoelectric cooler for heating or cooling the module as required, an optical attenuator for attenuating the output of the diode and a pair of wavelength monitors, one a long-wavelength, the other a short-wavelength monitor.

The wavelength monitors are constituted by a pair of photodiodes chosen to respond most sensitively to wavelengths respectively slightly above and slightly below the nominal operating wavelength of the laser. The monitor outputs are taken to respective gain-control sections 32, 33 each of which may be conveniently realised simply as a resistor, the current output of the diodes causing a voltage drop across the respective resistors which can be used as a voltage input to the ADC stage 14. The values of the resistors are chosen to provide equal signal amplitudes across the resistors at the respective response peaks of the photodiodes and to ensure that the voltage output range of the gain-control sections 32, 33 is within the specified input-voltage range of the ADC 14.

The ADC section 14 has four inputs, one for each of the two wavelength monitors as already mentioned, one for the thermistor and one for the power monitor 16. The thermistor is connected as part of a Wheatstone bridge 34, whose output is taken to the ADC 14 via a gain stage 36. The bridge provides an output voltage which is proportional to the difference between the desired temperature and the measured temperature. A further gain stage 38 interface the power monitor 16 to the ADC 14. The ADC stage 14 converts the analogue signals delivered by the various monitoring sections into digital signals and feeds them to the controller 12, which in the illustrated embodiment is realised as an FPGA (Field Programmable Gate Array). The controller may alternatively be realised as an ASIC (Application-Specific Integrated Circuit) or even as part of a fast microprocessor arrangement. An FPGA, however, provides an attractive combination of speed, cost-effectiveness and flexibility.

Figure 2:
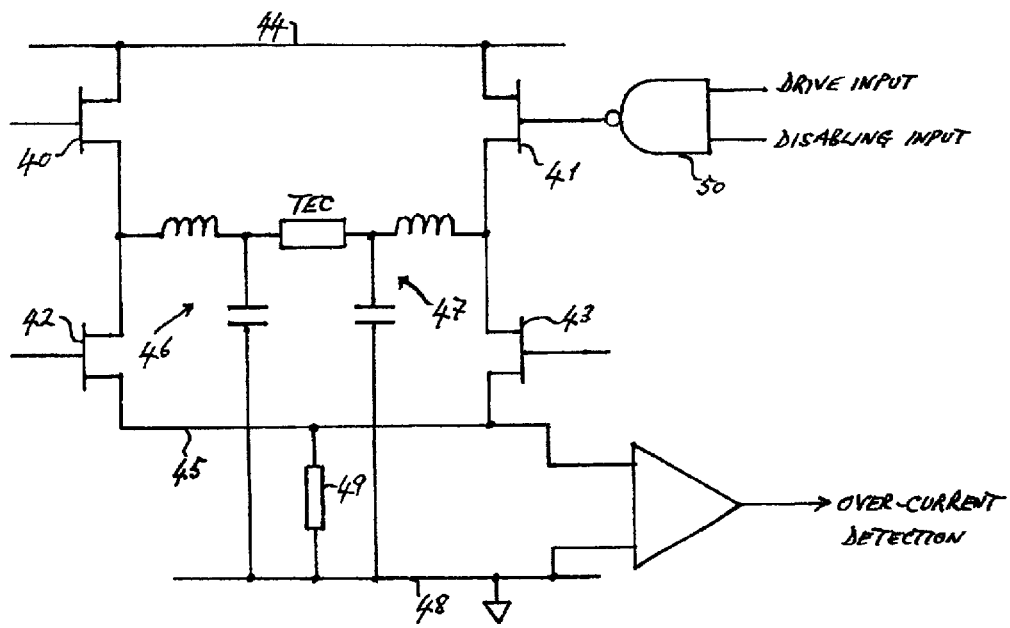
FIG. 2 is a circuit diagram of a MOSFET bridge employed in the laser-control apparatus of FIG. 1.

The thermo-electric cooler (TEC) onboard the laser module is fed from a MOSFET switching bridge 24. This is illustrated in FIG. 2 and comprises a conventional configuration of four MOSFETs 40-43 connected in two series chains across a DC supply 44, 48 via a common resistor 49, the centre-points of the two chains forming the output terminals of the bridge which supply the TEC. Filter arrangements 46, 47 consisting of an inductor and capacitor in series between each output terminal and the ground line 48 serve to filter out fast switching transients in the interest of EMC (Electromagnetic Compatibility) requirements, and also reduce ripple. These filter arrangements correspond to the filter 18 in FIG. 1. Further ripple filtering is provided by the fact that the large thermal mass of the laser module acts as a low-pass filter and therefore provides some smoothing action of its own. Resistor 49 is included as an over-current sensor. Thus, if for example FET 40 were to go short-circuit and FET 42 were subsequently to be switched on, a very high current would flow through the FETs concerned endangering the circuitry. (Other equally injurious scenarios are possible). Under these circumstances, a high voltage would be dropped across resistor 49 and this could be detected and used to turn off the TEC drive. Turn-off may be by way of disabling inputs to each of the FET's via drive NAND-gates 50 (of which only one is shown).

Figure 3:
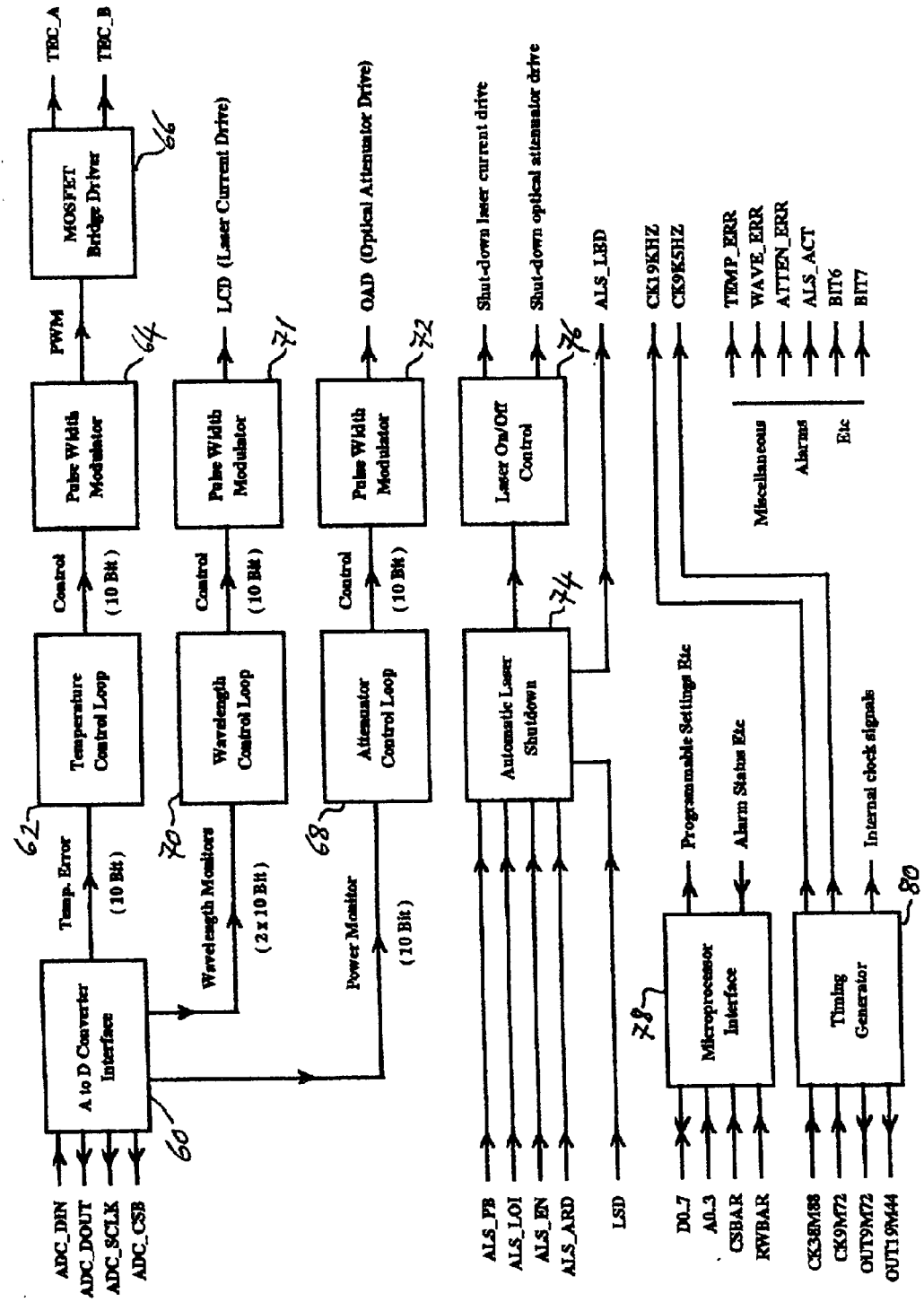
FIG. 3 is block schematic diagram of a gate-array controller portion of the apparatus of FIG. 1.

The constitution of the FPGA controller is shown in preferred form in FIG. 3. In FIG. 3 the ADC outputs are taken to an ADC interface section 60, which delivers temperature, power-monitor and wavelength-monitor signals each of 10-bits width (two 10-bit signals make up the wavelength part of this section). The controller comprises three separate control loops: a temperature-control loop based on a temperature-control block 62, an attenuator-control loop based on an attenuator-control block 68 and a wavelength-control loop based on a wavelength-control block 70. Entering the temperature-control block 62 is a temperature-error signal from the ADC Interface, this signal being the error output of the Wheatstone bridge 34. In the case of the wavelength control block 70, this takes the values output by the wavelength monitors, performs an operation on these values and compares the result with a desired value of such a result, and in the case of the power-control block 68, this compares the actual power value output by the ADC interface 60 with a desired power level supplied—as already mentioned—by the microprocessor 30.

The outputs of the control blocks 62, 68, 70 operate respective pulse-width modulators 64, 71, 72 which provides the drive to the respective laser-module items, namely the heater/cooler (TEC), the attenuator and the laser diode. Drive to the TEC is via a MOSFET bridge driver 66 feeding drive signals to the MOSFET bridge 24, the preferred embodiment of which has already been described in connection with FIG. 2.

Also contained within the controller 12 is an ALS block 74 which receives, among other signals, signals relating to the state of the fibre being serviced by the laser and which enables the laser diode drive via a block 76. Various other miscellaneous items are also included, e.g. an interface 78 for the microprocessor and a timing generator 80 for generating the various clock signals required by the system.

The FPGA provides the following sequence of operations:

Before current is provided to the laser diode, the laser is allowed to reach its nominal operating temperature, i.e. the temperature specified by the manufacturer at which the equipment will operate at its design wavelength. To achieve this, the temperature control loop 62 is brought into play, the signal appearing at the output of the control-loop block 62 being used to modulate the width of a pulse signal to the MOSFET bridge 24 driving the TEC on the laser module. Under-temperature will result in a heating action on the part of the TEC, over-temperature—when this is reached—will result in a cooling action. Thus a point is reached at which the laser temperature is stabilised at a level giving rise to zero (or near-zero) error signal from the Wheatstone Bridge 34.

During this temperature-stabilisation period the attenuator on the laser module may be set to maximum attenuation if desired, but this is not actually necessary since laser current is zero during this phase.

Next, current is applied to the laser diode, but not without setting attenuation to maximum if this has not already been done before or during the temperature-stabilisation phase. Initially, a value of current equal to the manufacturer's nominal specified drive current is applied in order to bring the laser drive into roughly the correct operating range to begin with. Then the current control loop is brought into play and the final steady-state current brought to the desired level.

Figure 4:
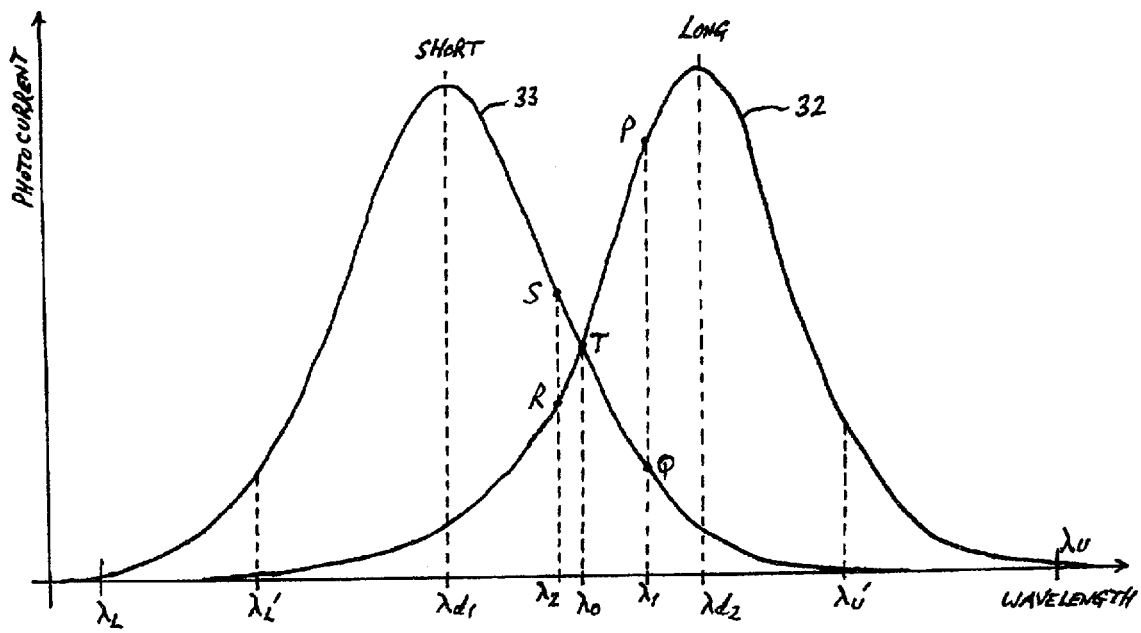
FIG. 4 is a graphical representation of the photocurrent/wavelength characteristic of a photodiode used as a wavelength detector in an embodiment of the invention.

This process can be more clearly explained with the aid of FIG. 4. In FIG. 4 the current/wavelength characteristic of the photodiodes used as the wavelength monitors is shown and can be seen to peak at respective points $\lambda_{d1}$ and $\lambda_{d2}$ slightly below and slightly above the nominal operating wavelength of the laser. During control-loop operation: the outputs of the gain-control sections 32 and 33 are monitored in the FPGA 12 and their amplitudes compared. If, for example, the laser wavelength is $\lambda_1$ as shown, the long-wavelength monitor 32 will output a high-amplitude signal due to its response at point P, whereas the short-wavelength monitor 33 will output a low-amplitude signal due to its response at point Q. This will cause the laser-diode current to be changed in a sense such as to cause the operating wavelength to shorten, bringing it further down the x-axis. Assuming, for the sake of argument, that the new wavelength is as shown at $\lambda_2$, this would give rise to monitor outputs corresponding to new operating points R and S on monitors 32 and 33, respectively. Loop control continues until the monitor outputs are equal, this corresponding to the operating point $\lambda_0$ at the intersection of the two current-wavelength curves.

A problem, however, arises where the initial laser current is set at a level which is too high or too low. When the initial laser current is below that which produces the wavelength $\lambda_L$ or above that producing the wavelength $\lambda_U$, the outputs from the monitors are substantially equal and bottomed out, so that the control loop cannot converge at the desired wavelength value. In order to obviate this problem, an initial laser-current value which produces a wavelength within an arbitrary range $\lambda_U'-\lambda_L'$ is applied, or preferably within the range $\lambda_{d2}-\lambda_{d1}$. Most advantageously the preferred preloaded value is that giving an operating $\lambda$ as close to the desired value as possible, i.e. the manufacturer's rated current value for the already-prevailing rated laser temperature.

The wavelength-control loop 70 operates by subtracting the 10-bit digital output derived from the high-$\lambda$ monitor from the 10-bit digital output derived from the low-$\lambda$ monitor and by performing a 2-s complement process on the result. In practical terms this it effected by adding 10000000000 to the subtraction result. A value of 100000000100 indicates zero wavelength error.

Once operating wavelength is within acceptable limits, the attenuation factor of the attenuator is reduced to the desired level, i.e. the level which results in the desired value of output power into the optical fibre system.

Figure 5:
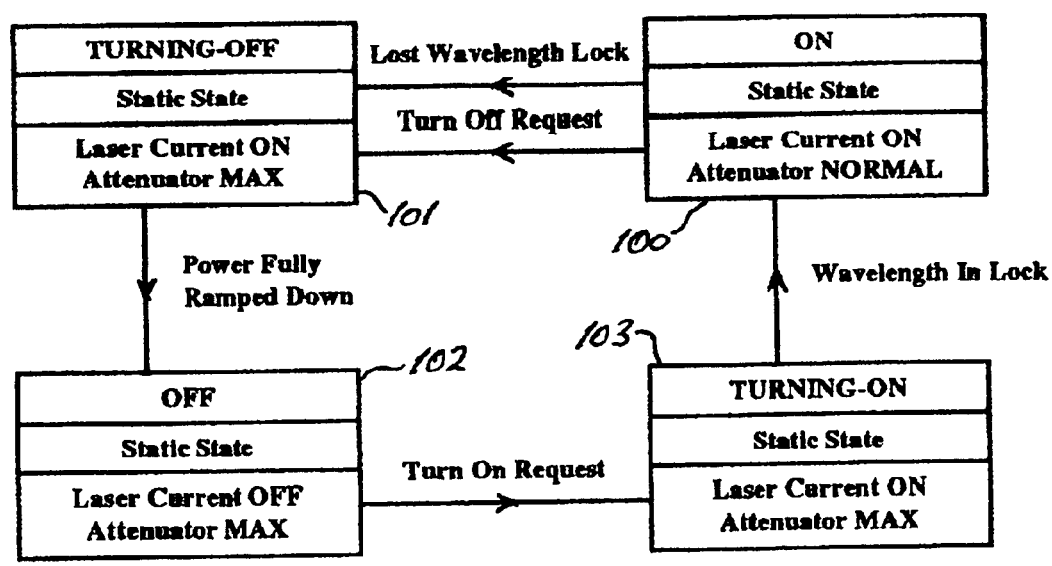
FIG. 5 is a diagram showing the various laser-control states involving the relationship between laser current and attenuation.

The relationship of attenuation factor and laser-diode current during the various operational phases is more particularly explained with reference to FIG. 5. In FIG. 5 the laser drive arrangement is seen to assume any of four possible static states, depending on the prevailing conditions. The normal operating condition is shown by box 100. This is the normal "ON" condition in which the laser current is ON and the current and temperature both stabilised. If then for any reason the operating wavelength is no longer in lock, or there is a request to turn off the laser (e.g. during ALS mode), box 01 comes into play, in which the attenuator is set to maximum attenuation while laser current is still at its normal operating level. Once the output power has been fully ramped down, an OFF state is generated in box 102, in which, with attenuation at maximum, laser current is reduced to zero. The laser will sit in this state until a "turn-on" request is received (e.g. during ALS mode), upon which, with attenuation still at maximum, the laser current is brought up to the required level in order to achieve wavelength lock (box 103). Once lock has been achieved, attenuation is adjusted to the normal operating level, thus returning to the "normal-state" box 100.

The invention envisages that the "lost wavelength-lock" alarm would be generated whenever:

(a) the wavelength error was outside the specified tolerances, or (b) both wavelength monitor output values were less than or greater than a designated quantity, or (c) the temperature control loop was out of lock.

When ALS mode is initiated (this may be done manually by the user, for example, or automatically once a fibre break has been sensed), a turn-off request is issued and box 101 is entered in FIG. 5, followed by box 102. The laser remains OFF for about 90 seconds, following which it is arranged for a short automatic "TEST" phase to be entered. This lasts for approximately 2 seconds and is intended to detect whether or not the fibre break has been repaired during the previous 90-second "dead" period. During this 2-second phase, the laser is turned on and wavelength lock achieved and a check is then made to see if power loss is still occurring on the fibre system. If it is, ALS mode continues with another 90-second wait, followed by a further 2-second "TEST", and so on.

During the whole ALS phase, laser temperature is held at its normal operating level, so that wavelength lock can occur quite quickly during the short "TEST" period. Since in practice the current loop has a response time of around 250 ms and the attenuator loop around 50 ms, there is ample time for power-loss detection to occur during the 2-second test period without any cross-channel interference being caused by unstable-wavelength problems at power-up.

The changes (i.e. increases and decreases) in attenuation described above are preferably not instantaneous, but gradual, and preferably ramped in a linear fashion. This applies also to the ALS mode during the cutting off of power to the broken optical-fibre line. Thus, although it is desired to minimise the risk of damage to operating or service personnel at the fibre-break end, it is still considered best to minimise wavelength deviations by ramping down the power level, the time over which ramping occurs (approximately 100 ms) being only a small proportion of the time during which operating personnel might be at risk from the broken link.

When in FIG. 5 it is stated that attenuation will be switched to "normal" once wavelength is "in lock" (transition from box 103 to box 100), this can mean in practice that attenuation begins to be ramped to the normal level once wavelength has come within a specified tolerance, but is still heading for its final, optimum value. Maximum attenuation in a practical system might be of the order of 16 dB down from 0 dBm.

We claim:

1. A method of controlling a laser module in a wavelength division multiplexing application, the module including temperature control means for controlling a temperature of a laser and a variable attenuation attenuator connected to an output of the laser for controlling power of radiation output from the module, the method comprising the steps of, in the order given:
   (a) before applying a laser current to operate the lase module, establishing a predetermined laser temperature using the temperature control means, and setting the attenuator to a maximum attenuation;
   (b) applying the laser current having a value which produces a nominal desired wavelength, and controlling the laser current to give a wavelength of operation substantially equal to the desired wavelength; and
   (c) reducing the maximum attenuation of the attenuator to a level to give a predetermined output power from the laser module.

2. The method according to claim 1, wherein the attenuation is reduced gradually during step (c).

3. The method according to claim 2, wherein reduction of the attenuation starts while the wavelength of operation is still converging towards its final value.

4. The method according to claim 2, wherein the attenuation is increased gradually during shutdown of the laser.

5. The method according to claim 2, wherein the attenuation is reduced in ramp fashion.

6. The method according to claim 1, wherein steps (a), (b) and (c) are performed using respective control loops.

7. The method according to claim 6, wherein the control loops have different time responses.

8. The method according to claim 7, wherein a power-setting loop of the control loops has the fastest response, and wherein a temperature-setting loop of the control loops has the slowest response.

9. The method according to claim 6, wherein the control loops are digital control loops.

10. The method according to claim 1, wherein step (b) utilizes two wavelength-monitoring means having maximum sensitivity at wavelengths respectively slightly greater than and less than a nominal wavelength of operation.

11. The method according to claim 10, wherein the wavelength of operation corresponds to a wavelength which gives rise to equal output signals from the two wavelength monitoring means.

12. The method according to claim 2, wherein step (a) is performed only once when the laser module is initially powered up, the laser temperature being maintained constant while the laser module is in service.

13. The method according to claim 1, and setting the attenuation of the attenuator to the maximum attenuation prior to powering-down the laser.

14. The method as claimed in claim 13, wherein, during powering-up of the laser, following the setting of the attenuation to the maximum attenuation, a laser current is increased to a desired operating level and, when an operating wavelength of the laser has settled to a desired wavelength, or has come to within a given tolerance of the desired wavelength, the attenuation is reduced to a normal working level.

15. The method according to claim 14, wherein the attenuation is gradually reduced after the wavelength has settled to a final value.

16. The method according to claim 13, wherein, during powering-down of the laser, following the setting of the attenuation to the maximum attenuation, the laser current is reduced to a substantially zero level.

* * * * *